United States Patent
Kim et al.

(10) Patent No.: US 6,828,637 B2
(45) Date of Patent: Dec. 7, 2004

(54) SEMICONDUCTOR MEMORY DEVICES HAVING DUMMY ACTIVE REGIONS

(75) Inventors: Hong-Soo Kim, Kyunggi-do (KR); Jung-Dal Choi, Kyunggi-do (KR); Jong-Sun Sel, Seoul (KR); Yong-Joon Choi, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/794,533

(22) Filed: Mar. 5, 2004

(65) Prior Publication Data

US 2004/0171218 A1 Sep. 2, 2004

Related U.S. Application Data

(62) Division of application No. 10/135,947, filed on Apr. 29, 2002, now Pat. No. 6,740,940.
(60) Provisional application No. 60/333,680, filed on Nov. 27, 2001.

(51) Int. Cl.[7] .............................................. H01L 29/76
(52) U.S. Cl. ........................ 257/390; 257/68; 257/341; 257/401
(58) Field of Search .......................... 257/341, 68, 390, 257/401; 365/210, 208

(56) References Cited

U.S. PATENT DOCUMENTS

| | | | |
|---|---|---|---|
| 5,140,556 A | * 8/1992 | Cho et al. | 365/207 |
| 5,267,208 A | 11/1993 | Asano | 365/210 |
| 5,291,437 A | 3/1994 | Rountree | 365/149 |
| 5,867,434 A | 2/1999 | Oh et al. | 365/200 |
| 5,881,008 A | 3/1999 | Becker | 365/210 |
| 6,128,209 A | 10/2000 | Kuroki | 365/63 |
| 6,201,757 B1 | 3/2001 | Ward et al. | 365/230.05 |
| 6,295,222 B2 | 9/2001 | Higashide et al. | 365/63 |
| 6,365,928 B1 | 4/2002 | Yang et al. | 257/296 |
| 6,388,931 B1 | 5/2002 | Wilkins | 365/210 |
| 6,512,701 B1 | 1/2003 | Hamilton et al. | 365/185.29 |
| 6,551,895 B1 | * 4/2003 | Hsu et al. | 438/396 |

* cited by examiner

Primary Examiner—Richard Elms
Assistant Examiner—Douglas Menz
(74) Attorney, Agent, or Firm—Marger Johnson & McCollom, P.C.

(57) ABSTRACT

A semiconductor memory device having a dummy active region is provided, which includes a plurality of parallel main active regions and a dummy active region coupled to ends of the main active regions. The main preferably active regions are arranged in a main memory cell array region and extend to or through a dummy cell array region surrounding the main memory cell array region. Further, the dummy active region is perpendicular to the main active regions. A redundancy cell array region may intervene between the main memory cell array region and the dummy cell array region. In this case, the main active regions are extended to the dummy cell array region through the redundancy cell array region.

4 Claims, 7 Drawing Sheets

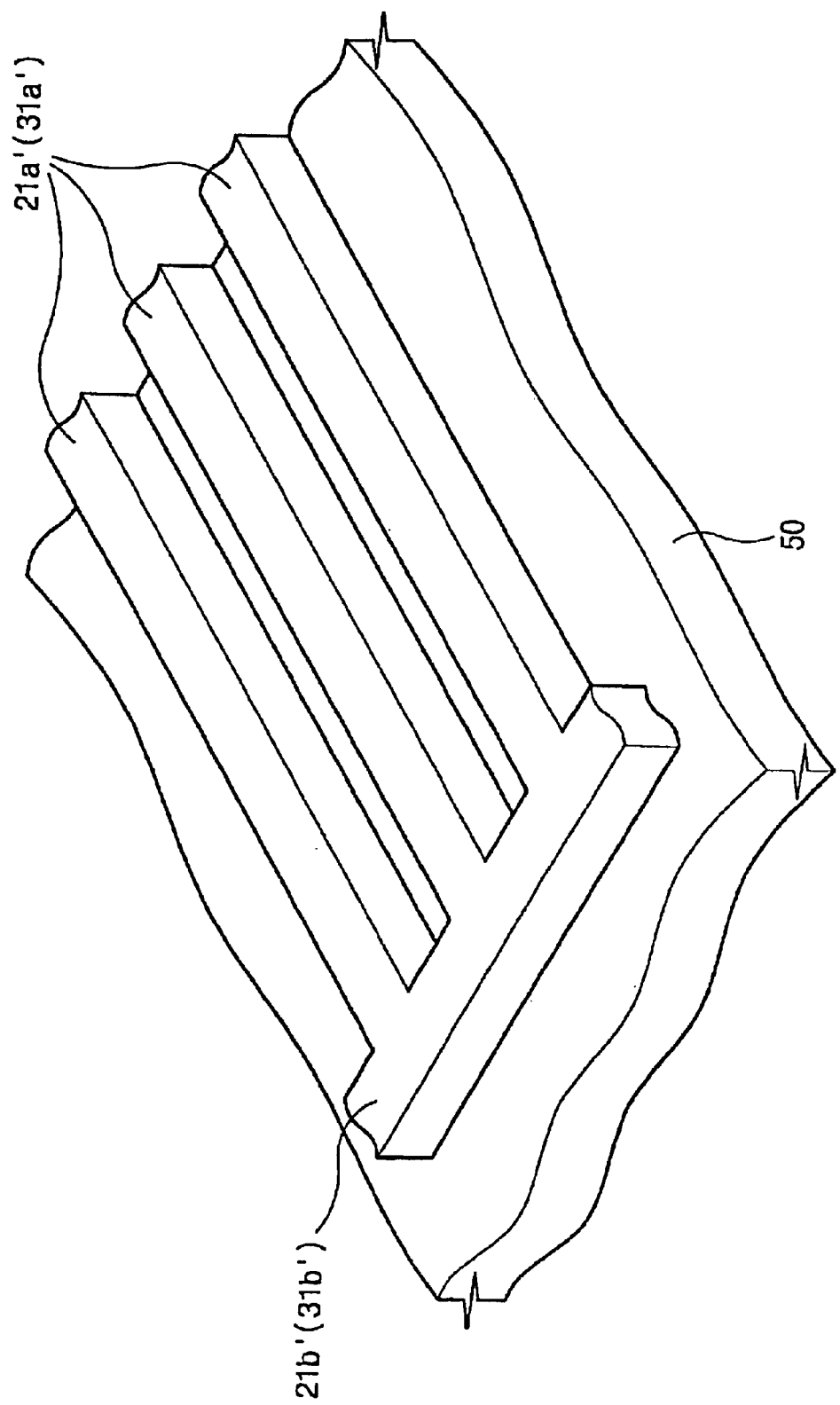

SEMICONDUCTOR MEMORY DEVICES HAVING DUMMY ACTIVE REGIONS

This application is a divisional of U.S. patent application Ser. No. 10/135,947 filed on Apr. 29, 2002, now U.S. Pat. No. 6,740,940, both of which claim priority from U.S. Provisional Patent No. 60/333,680, filed on Nov. 27, 2001, herein incorporated by reference in their entirety.

FIELD OF THE INVENTION

The present invention generally relates to semiconductor devices and, more particularly, to semiconductor memory devices having dummy active regions.

BACKGROUND OF THE INVENTION

Generally, semiconductor memory devices for storing data are classified into volatile memory devices and non-volatile memory devices. The volatile memory devices lose their stored data when their power supplies are interrupted, while the non-volatile memory devices continuously hold their stored data even when their power supplies are interrupted. Therefore, the non-volatile memory devices are widely used in memory cards, mobile telecommunication systems or the like.

FIG. 1 is an ideal top plan view for explaining a part of a cell array region of a conventional NAND flash memory device.

Referring to FIG. 1, a plurality of first parallel active regions 1a are arranged on a semiconductor substrate. A plurality of parallel wordlines WL1, ..., and WLn cross the first active regions 1a. A ground selection line GSL and a string selection line SSL cross the active regions 1a at both sides of the wordlines WL1, ..., and WLn, respectively. The first active regions 1a adjacent to the ground selection line GSL are interconnected by a second active region 1b that is a common source line CSL. The second active region 1b is parallel with the ground selection line GSL and is located opposite to the string selection line SSL. In addition, the first active regions 1a adjacent to the string selection line SSL are exposed by bitline contact holes 3.

The first and second active regions 1a and 1b are defined in one step of a photolithography/etching process. In this case, intersections A of the first and second active regions 1a and 1b are preferably patterned at an angle of 90°, as shown in FIG. 1. However, the intersections A are substantially rounded by a proximity effect during the photolithography process, as shown in FIG. 2. Therefore, a width of an actual common source line 1b' increases over that of the ideal common source line 1b. As a result, what is needed is to increase a chip size in order to maintain a minimum design rule between the actual common source line 1b' and the adjacent ground selection lines GSL.

Since the intersections A are rounded, a spacing between the first active regions 1a adjacent to the actual common source line 1b' is smaller than the minimum design rule. This results in the definition of an abnormal isolation region having a smaller width than the minimum design rule. Thus, in a case where a device isolation region is formed using a shallow trench isolation technique, voids 5 may be formed in the abnormal device isolation region. The voids 5 are filled with a conductive layer that is deposited to form the wordlines WL1, ..., and WLn, the ground selection line GSL, and the string selection line SSL. Although an etch process is performed to pattern the wordlines WL1, ..., and WLn, the ground selection line GSL, and the string selection line SSL, the conductive layer in the voids 5 may still remain. As a result, a leakage current path may be created between the ground selection line GSL and the actual common source line 1b'. Further, because the remaining conductive layer may act as particle sources during a subsequent cleaning process. Thus, the yield of semiconductor devices might be reduced.

In order to solve the above problems, a flash memory device was recently proposed which adopts a common source line made of a conductive layer (e.g., polysilicon layer) that is different from an active region.

FIG. 3 is a top plan view of a NAND flash memory device having a common source line made of a polysilicon layer, wherein a reference symbol "M" represents a main memory cell array region and a reference symbol "D" represents a dummy cell array region arranged around the main memory cell array region M. The dummy cell array region is provided to prevent abnormal patterns from being formed at an edge of the main memory cell array region due to a difference between pattern densities of the main memory cell array region and a peripheral circuit region surrounding the main memory cell array region. Therefore, patterns in the dummy cell array region are generally identical to those in the main memory cell array region.

Referring to FIG. 3, a plurality of parallel active regions 11a are arranged at a semiconductor substrate. The active regions 11a are arranged in the main cell array region M and extend through the dummy cell array region D. A redundancy cell region may be intervened between the main memory cell array region M and the dummy cell array region D. A plurality of parallel wordlines WL1, ..., and WLn are disposed across the active region 11a in the main memory cell array region M. A ground selection line GSL and a string selection line SSL are arranged at both sides of the wordlines WL1, ..., and WLn. Also, the ground selection line GSL and the string selection line SSL cross the active regions 11a.

A common source line 15 is arranged at one side of the ground selection line GSL. The common source line 15 is made of a conductive layer (e.g., polysilicon layer) that is different from the active regions 11a. Therefore, the common source line 15 is electrically connected to the active regions 11a via common source line contact holes 13. The active regions 11a adjacent to the string selection line SSL are exposed by bitline contact holes 17.

At least one dummy wordline DWL is arranged in the dummy cell array region. One or more dummy wordlines DWL cross the active regions 11a, as shown in FIG. 3.

According to the flash memory device shown in FIG. 3, bar-shaped active regions 11a are arranged in a cell array region and are parallel with one another. A common source line 15 is made of a conductive layer that is different from an active region. As a result, the problems above-mentioned in FIG. 1 and FIG. 2 can be solved. However, if a photolithography process for defining active regions 11a is carried out to realize the flash memory device of FIG. 3 on a semiconductor substrate, abnormal patterns 11a' may be formed, as shown in FIG. 4.

Referring to FIG. 4, a photoresist layer is coated on a semiconductor substrate in order to define active regions 11a shown in FIG. 3. Using a photo mask for forming the active regions 11a, the photoresist layer is then exposed. The exposed photoresist layer is developed, so that photoresist patterns 11a' are formed on the substrate to define the active regions 11a. Ends of the photoresist patterns 11a' are rounded by the proximity effect, as shown in FIG. 4. Thus, adhesion between the ends of the photoresist patterns 11a' and the substrate may be weakened. Since the developing process essentially includes a spin process to rotate the substrate, a part of the photoresist patterns 11a' may be lifted from a surface of the substrate during the developing process. This leads to formation of abnormal photoresist pattern 11b, as shown in FIG. 4.

SUMMARY OF THE INVENTION

A purpose of the present invention is to provide a semiconductor device forming process that is suitable for repeatably forming reliable active regions.

Another purpose of the present invention is to provide a semiconductor device increased integration density.

In order to achieve the above purposes, the present invention provides a semiconductor memory device having a dummy active region. The semiconductor memory device includes a plurality of parallel main active regions and a dummy active region, which are arranged on a semiconductor substrate. The dummy active region connects ends of the main active regions to each other and is arranged to be perpendicular to the main active regions.

According to an aspect of the present invention, the semiconductor substrate has a main memory cell array region and a dummy cell array region surrounding the main memory cell array region. (Those skilled in the art will appreciate that, typically, plural main memory cell array regions like those shown are provided, with dummy cell array regions surrounding each such memory cell array region.) The main active regions are arranged in the main memory cell array region and extend or preferably through to the dummy cell array region. Therefore, ends of the main active regions are located in the dummy cell array region. As a result, the dummy active region is also arranged in the dummy cell array region. The main memory cell array region further includes a plurality of common source lines crossing over the main active regions. The common source lines comprise conductive layer patterns, e.g., doped polysilicon patterns, metal silicide patterns or metal patterns. Each of the common source lines is electrically connected to predetermined regions of the main active regions via common source line contact holes. Alternately, each of the common source lines may be electrically connected to the main active regions via a slit-type contact hole exposing the main active regions and device isolation layers therebetween.

The main memory cell array region may further include string selection lines arranged at both sides of the respective common source lines. The string selection lines cross over the main active regions. A ground selection line is arranged between each of the string selection lines and each of the common source lines. Also, the ground selection line crosses over the main active regions. In addition, a plurality of parallel wordlines are arranged between the ground selection line and the string selection line. Also, the wordlines cross over the main active regions. As a result, the main memory cell array region includes a plurality of NAND-type strings that are arranged 2-dimensionally.

Alternately, the main memory cell array region may include a couple of wordlines arranged between the common source lines and a plurality of bitlines electrically connected to the main active regions between the couple of the wordlines. The bitlines cross over the wordlines and the common source lines. As a result, the main memory cell array region may include a plurality of NOR-type flash cells that are arranged 2-dimensionally.

According to an embodiment of the present invention, a redundancy cell array region may intervene between the main memory cell array region and the dummy cell array region. The redundancy cell array region includes redundant cells (or redundant strings) for repairing bad cells (or bad strings) in the main memory cell array region. Alternately, the redundancy cell array region may act as a region for storing chip information. In case the present invention includes the redundancy cell array region, the main active regions are extended to the dummy cell array region through the redundancy cell array region.

According to the invention, ends of the main active regions are coupled to each other via a dummy active region. Therefore, during a photolithography process for defining both the main active regions and the dummy active region, photoresist patterns defining the main active regions are supported by a photoresist pattern defining the dummy active region. Thus, although a photolithography process including a spin process is carried out, it is possible to prevent the photoresist patterns defining the main active regions from being lifted or deformed due to a centrifugal or other lateral force incident upon their radial ends.

BRIEF DESCRIPTION OF THE DRAWINGS

FIG. 7 is an isometric view illustrating a photolithography process for defining active regions as shown in FIG. 5 or FIG. 6.

DESCRIPTION OF THE PREFERRED EMBODIMENT

Figure 1:
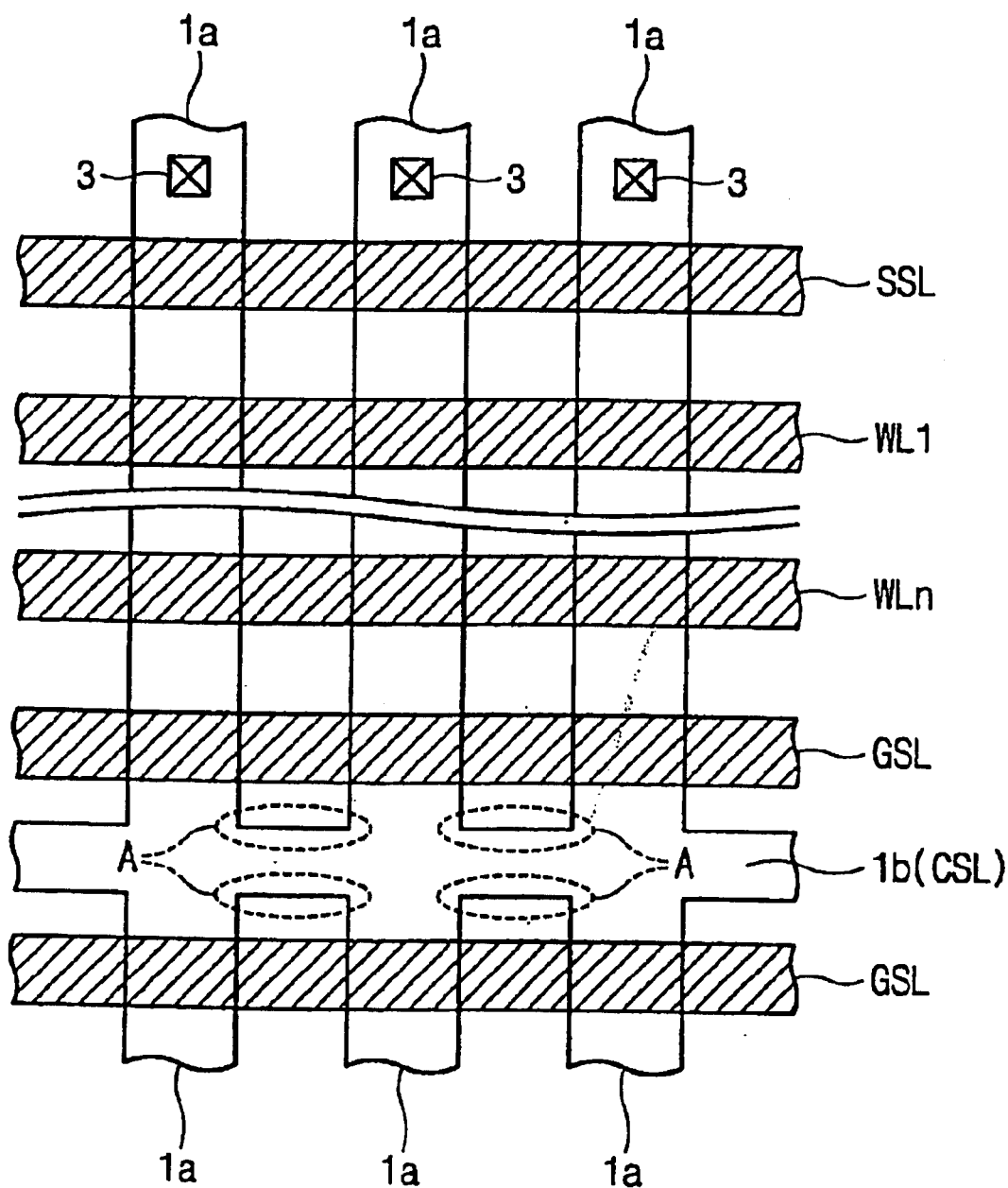
FIG. 1 is an ideal top plan view of a conventional NAND flash memory device having a common source line comprising an active region.
Figure 2:
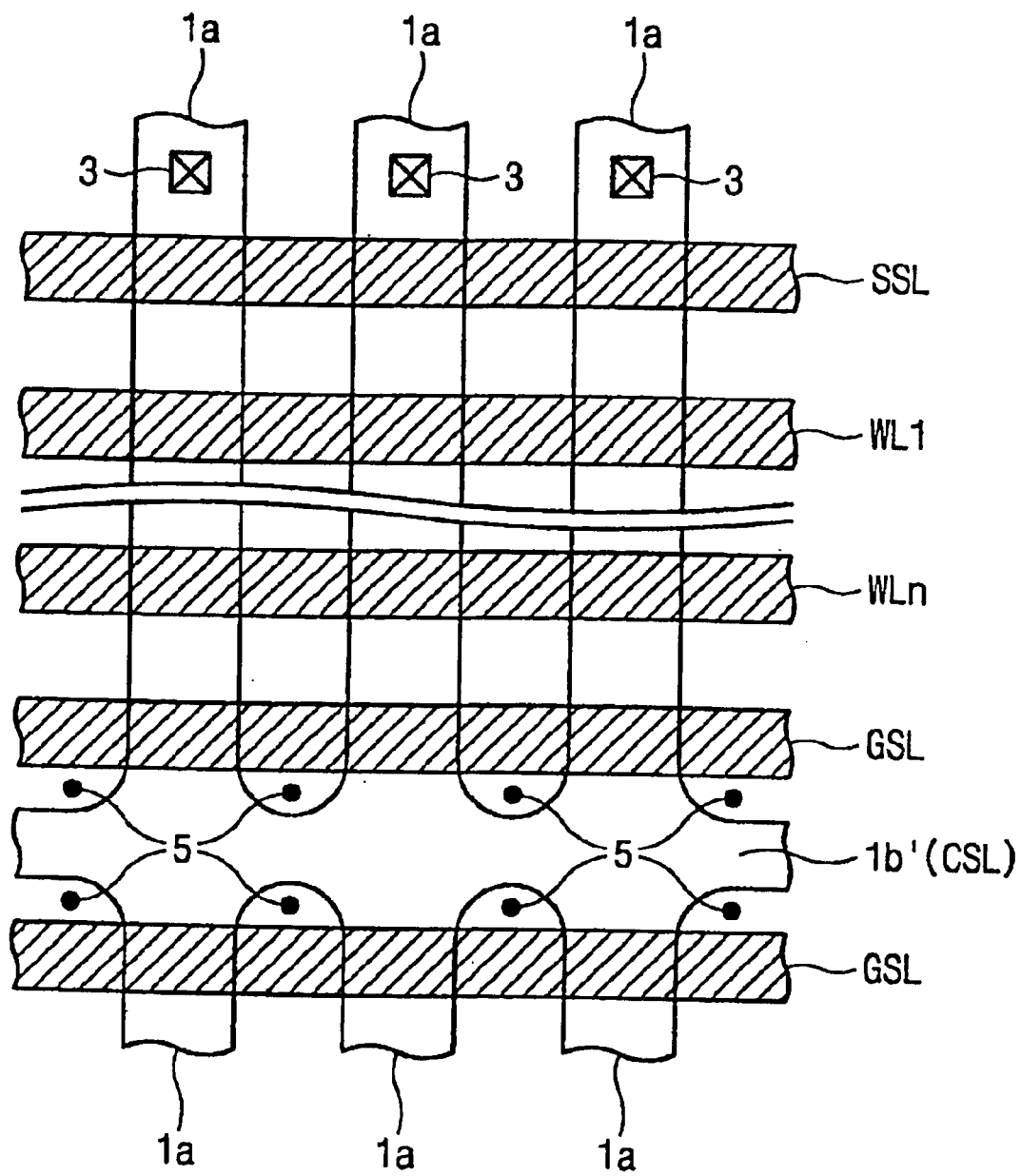
FIG. 2 is an actual top plan view of a conventional NAND flash memory device having a common source line comprising an active region.
Figure 3:
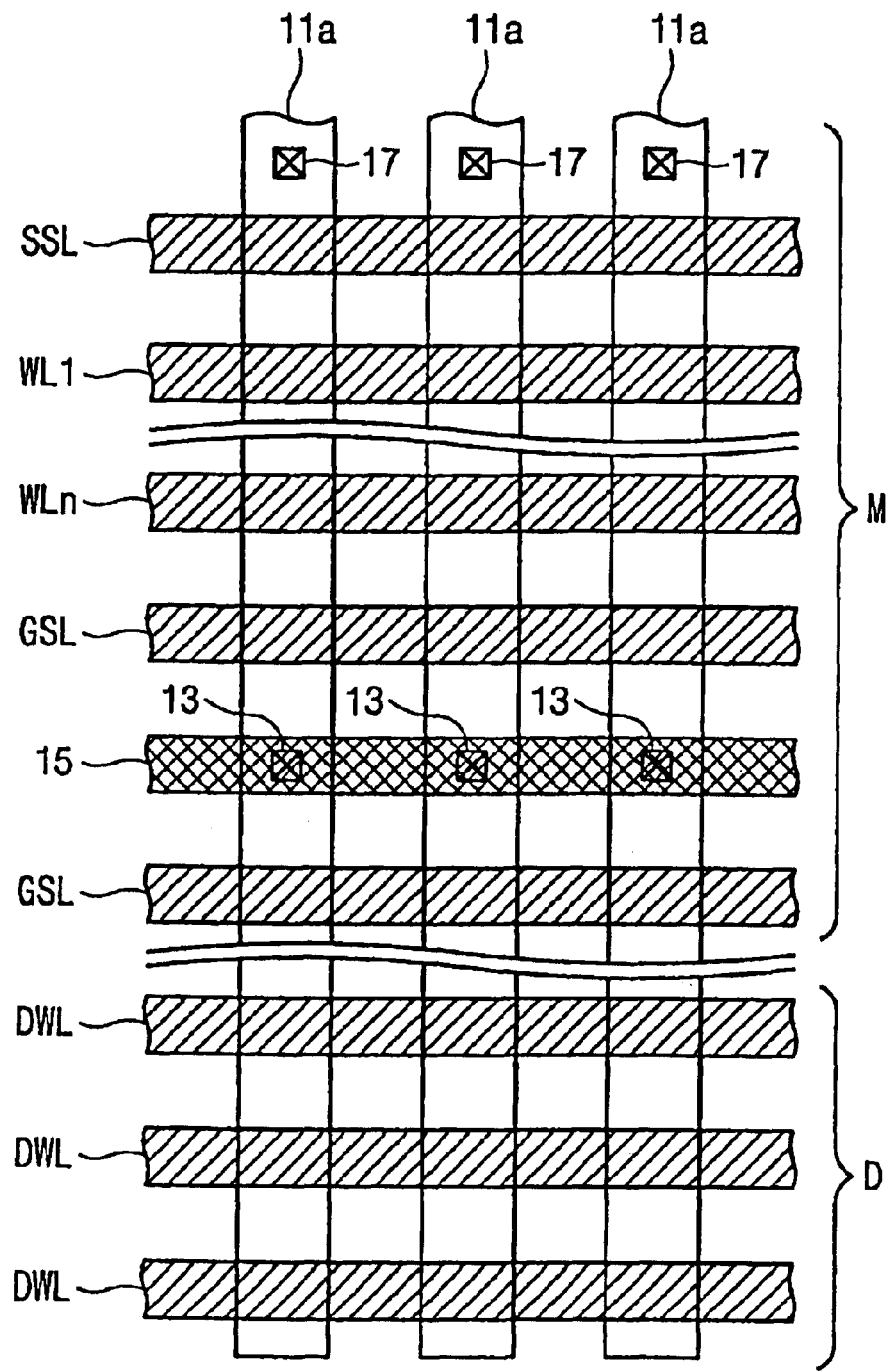
FIG. 3 is a top plan view of a conventional NAND flash memory device having a common source line comprising a conductive layer.
Figure 4:
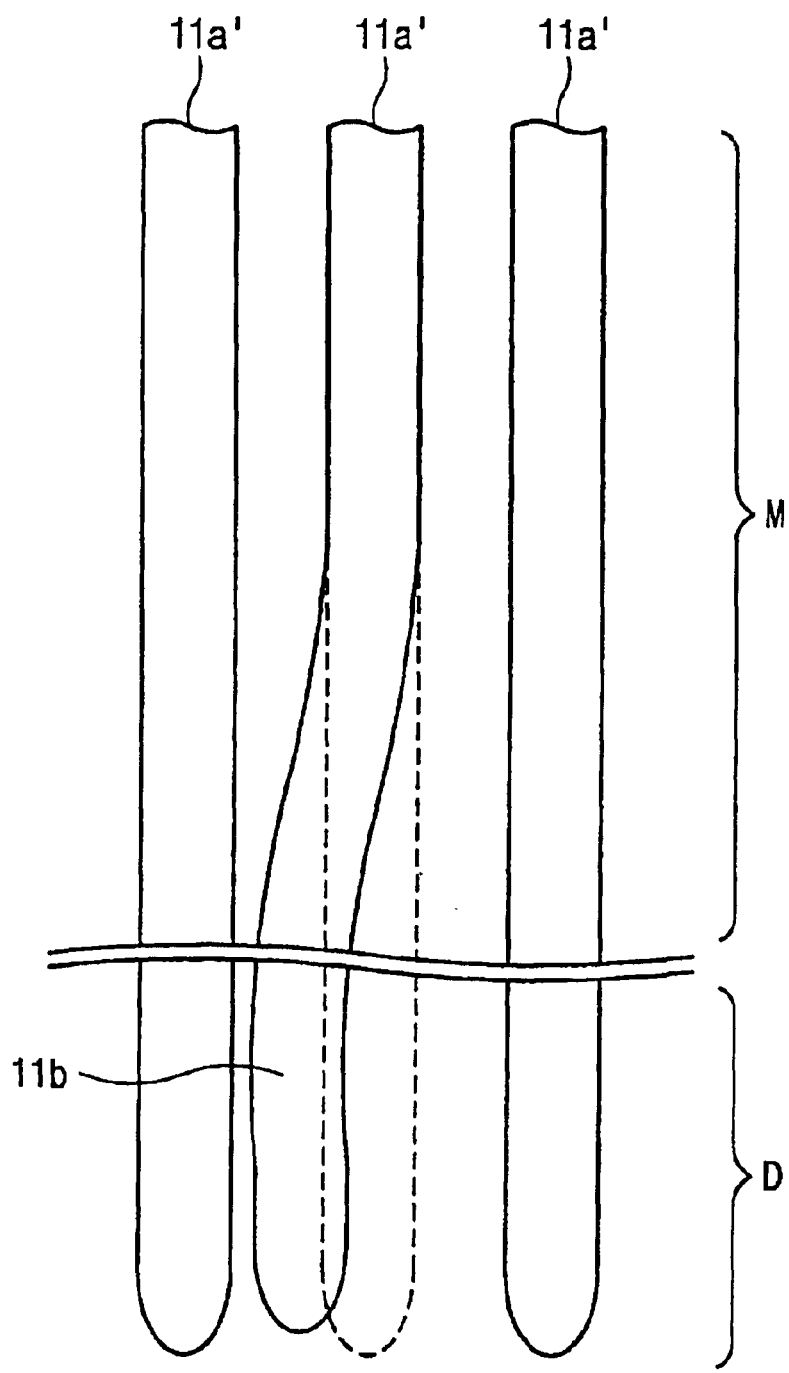
FIG. 4 is a top plan view illustrating an abnormal pattern formed after a photolithography process for defining the active region of FIG. 3.
Figure 5:
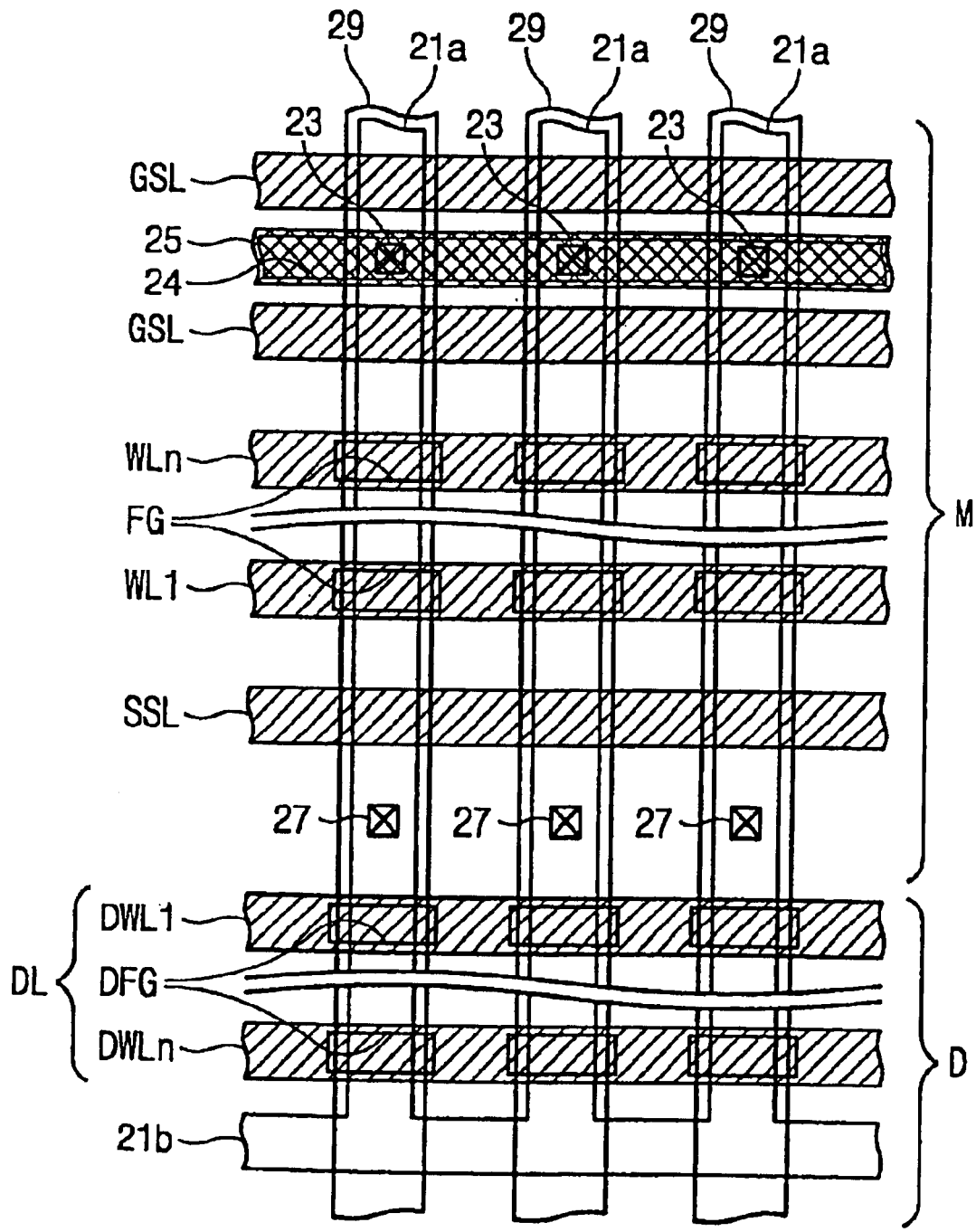
FIG. 5 is a top plan view of a NAND flash memory device according to the present invention.

FIG. 5 illustrates a part of a NAND flash memory device according to the present invention.

As illustrated in FIG. 5, a plurality of parallel main active regions 21a are arranged in a main memory cell array region M of a semiconductor substrate. Each of the main active regions 21a is bar-shaped. The main active regions 21a extend through a dummy cell array region D surrounding the main memory cell array region M. A redundancy cell array region may intervene between the main memory cell array region M and the dummy cell array region D. Therefore, if the redundancy cell array region intervenes therebetween, the main active regions 21a pass the redundancy cell array region. The redundancy cell array region includes a redundant string that can replace a bad string.

In the dummy cell array region D, a dummy active region 21b is arranged in parallel with a crossing direction of the main active region 21a. The dummy active region 21b is coupled to ends of the main active regions 21a. As a result, the main active regions 21a are interconnected via the dummy active region 21b.

A plurality of common source lines 25 crossing over the main active regions 21a are arranged in the main memory cell array region M. Each of the common source lines 25 is electrically connected to predetermined regions of the main active regions 21a via common source line contact holes 23. Alternately, each of the common source lines 25 may be electrically connected to the main active regions 21a via a slit-type contact hole 24 exposing the main active regions 21a and device isolation layers therebetween. The common source lines 25 comprise conductive layer patterns such as doped polysilicon patterns, metal silicide patterns or metal patterns. A string selection line SSL is arranged at both sides of the respective common source lines 25. The string selection line SSL cross over the main active regions 21a. Therefore, string selection transistors are formed at areas where the string selection lines SSL and the main active regions 21a intersect.

A ground selection line GSL is arranged between each of the string selection lines SSL and each of the common source lines 25. Also, the ground selection line GSL crosses over the main active regions 21a. Therefore, ground selection transistors are formed at intersections of the ground selection line GSL and the main active regions 21a. A plurality of parallel wordlines WL1, . . . , and WLn are arranged between the ground selection line GSL and the string selection line SSL. The wordlines WL1, . . . , and WLn cross over the main active regions 21a. Floating gates FG intervene between the wordlines WL1, . . . , and WLn and the main active regions 21a. As a result, flash memory cells are formed at intersections of the wordlines WL1, . . . , and WLn and the main active regions 21a. Instead of the floating gates FG, a charge storage layer made of silicon nitride may intervene therebetween. In this case, the flash memory cells correspond to flash memory cells having a silicon-oxide-nitride-oxide-silicon (SONOS) structure.

The main active regions 21a adjacent to each of the string selection lines SSL are exposed by bitline contact holes 27 that are opposite to the ground selection line GSL. In addition, a plurality of bitlines 29 are arranged in the main memory cell array region M. The bitlines 29 cross over the wordlines WL1, . . . , and WLn, the ground selection line GSL, the string selection line, and the common source lines 25. Each of the bitlines 29 is electrically connected to the main active region 21a via a corresponding one of the bitline contact holes 27. The bitlines 29 extend through the dummy cell array region D to a core region in which a sense amplifier (not shown) is located. As a result, the main memory cell array region M includes a plurality of NAND-type strings that are arranged 2-dimensionally.

The dummy cell array region D includes a plurality of dummy lines DL crossing over the main active regions 21a. The dummy lines DL correspond to dummy wordlines DWL1, . . . , and DWLn. Dummy floating gates DFG intervene between the dummy wordlines DWL1, . . . , and DWLn and the main active regions 21a. As a result, at least one row of dummy strings are arranged in the dummy cell array region D. The dummy strings serve to prevent abnormal definition of patterns arranged at an edge of the main memory cell array region M or the redundancy cell array region. That is, the dummy cell array region D is arranged for enhancing pattern uniformity in the main memory cell array region M or the redundancy cell array region. On the other hand, cells in the redundancy cell array region may be used as memory cells for storing chip information.

Figure 6:
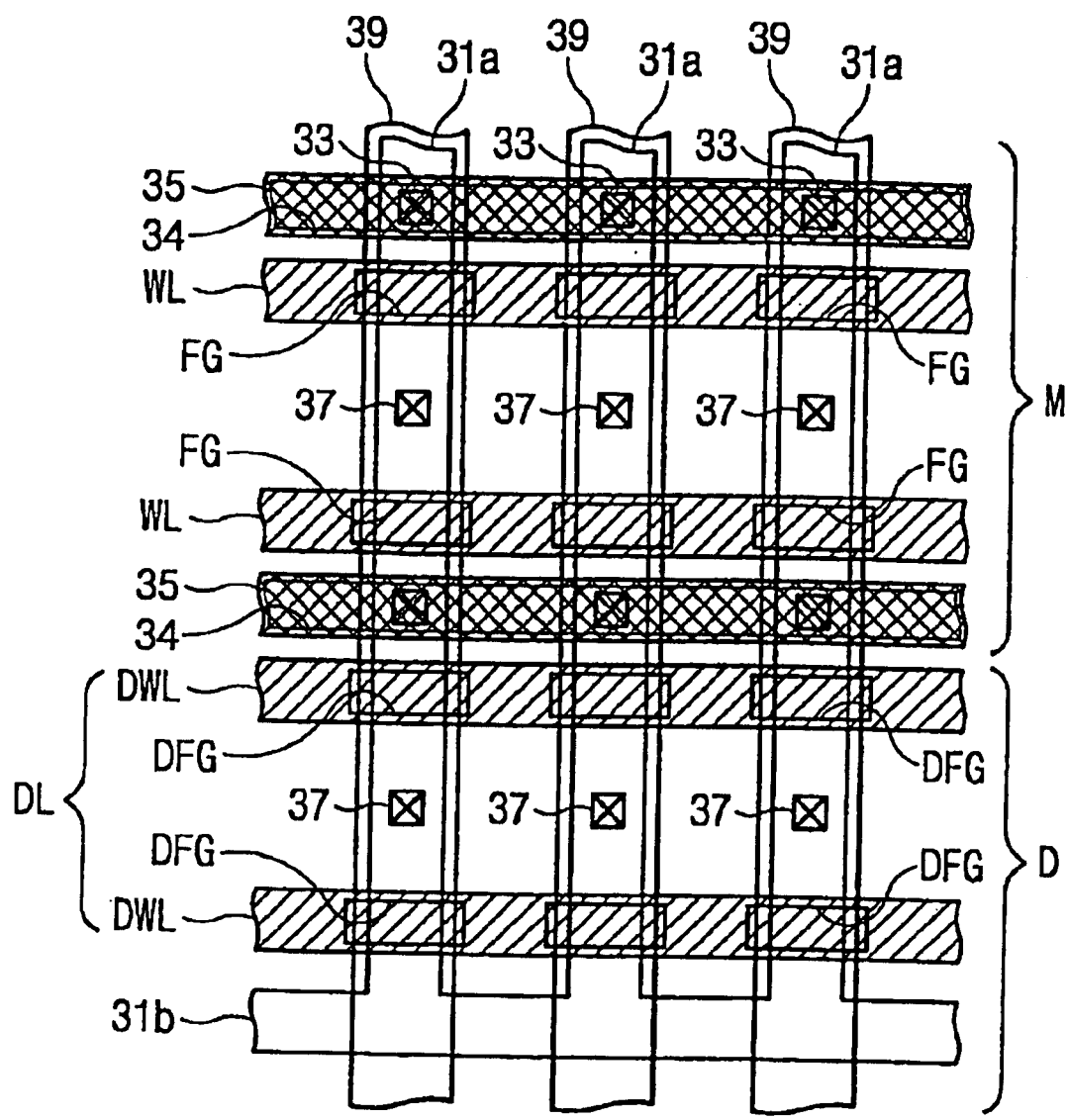
FIG. 6 is a top plan view of a NOR flash memory device according to the present invention.

FIG. 6 illustrates a part of a NOR flash memory device according to the present invention.

As illustrated in FIG. 6, a plurality of parallel main active regions 31a are arranged in a main memory cell array region M of a semiconductor substrate. Each of the main active regions 31a is bar-shaped. Similar to the NAND flash memory device shown in FIG. 5, the main active regions 31a is extended to a dummy cell array region D surrounding the main memory cell array region M. In addition, a redundancy cell array region may intervene between the main memory cell array region M and the dummy cell array region D. Therefore, the main active regions 31a pass the redundancy cell array region, like the NAND flash memory device as shown in FIG. 5. In the dummy cell array region D, a dummy active region 31b is arranged in parallel with a crossing direction of the main active regions 31a. The dummy active region 31b is coupled to ends of the main active regions 31a. As a result, the main active regions 31a are interconnected via the dummy active region 31b.

A plurality of common source lines 35 crossing over the main active regions 31a are arranged in the main memory cell array region M. The common source lines 35 have the same structure as the common source lines 25 of FIG. 5. Each of the common source lines 35 is electrically connected to predetermined regions of the main active region 31a via common source line contact holes 33. Alternately, each of the common source lines 35 may be electrically connected to the main active regions 31a via a slit-type contact hole 34 exposing the main active region 31a and device isolation layers therebetween. A couple of parallel wordlines WL are arranged between the common source lines 35. The wordlines WL cross over the main active regions 31a. The main active regions 31a between the wordlines WL are exposed by bitline contact holes 37. In addition, a plurality of bitlines 39 crossing over the wordlines WL and the common source lines 35 are arranged in the main memory cell array region M. The bitlines 39 are electrically connected to predetermined regions of the main active region 31a via the bitline contact holes 37. Floating gates FG intervene between the wordlines WL and the main active regions 31a. As a result, the main memory cell array region M includes a plurality of NOR-type flash memory cells that are arranged 2-dimensionally.

The dummy cell array region D includes a dummy line DL crossing over the main active regions 31a. The dummy line DL includes at least one dummy wordline, e.g., a couple of dummy wordlines DWL. Further, dummy floating gates DFG intervene between the dummy wordlines DWL and the main active regions 31a. Therefore, at least one row of dummy flash memory cells, e.g., two rows of dummy flash memory cells, are arranged in the dummy cell array region D. The main active regions 31a between the dummy wordlines DWL may be exposed by bitline contact holes 37, so that the bitlines 39 may be electrically connected to the main active region 31a in the dummy cell array region D via the bitline contact holes 37. The dummy cell array region D is arranged for enhancing pattern uniformity in the main cell array region and the redundancy cell array region.

FIG. 7 is a perspective view illustrating photoresist patterns formed after a photolithography process for defining the main active regions 21a or 31a and the dummy active region 21a' or 31a' of FIG. 5 or FIG. 6.

Referring to FIG. 7, a pad oxide layer (not shown) and a pad nitride layer (not shown) are sequentially formed on a semiconductor substrate 50. A photoresist layer is coated on the pad nitride layer. A semiconductor substrate including the photoresist layer is loaded in an exposing system such as a stepper. Before loading the semiconductor substrate in the exposing system, a photo mask having comb patterns corresponding to the main active regions 21a or 31a and the dummy active region 21a' or 31a' is installed therein. After the photo mask and the semiconductor substrate are aligned, a light such as ultraviolet ray is irradiated to the photo mask to expose the photoresist layer.

When the exposed photoresist layer is developed, first and second photoresist patterns 21a' and 21b (or 31a' and 31b') shown in FIG. 7 are formed. The first photoresist patterns 21a' (or 31a') define the main active regions 21a or (31a) shown in FIG. 5 (or FIG. 6), and the second photoresist patterns 21b' (or 31b') define the dummy active region 21b (or 31b) shown in FIG. 5 or FIG. 6. Therefore, the second photoresist patterns 21b' (or 31b') support the first photoresist patterns 21a' (or 31a'). Thus, although the semiconductor substrate 50 is rotated during the developing process, it is possible to prevent the first photoresist patterns 21a' or 31a' from being lifted or deformed due to a centrifugal or other lateral force. As a result, a normal device isolation region can be defined.

As described, ends of main active regions are coupled to a dummy active region. Therefore, when photoresist patterns for defining the main active region and the dummy active region are formed by a photolithography process, it is possible to prevent the photoresist patterns from being lifted or deformed due to a centrifugal or other lateral force. As a result, a reliable semiconductor memory device can be fabricated. It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:
1. A NOR flash memory device comprising:
    a semiconductor substrate having a main memory cell array region and a dummy cell array region surrounding the main memory cell array region;
    a plurality of parallel main active regions arranged at the substrate in the main memory cell array region, the main active regions extending along the substrate through the dummy cell array region;
    a dummy active region coupled to ends of the main active regions, the dummy active region crossing the main active regions;
    a plurality of common source lines crossing over the main active regions in the main memory cell array region;
    plural parallel wordlines intervened between the common source lines;
    at least one dummy wordline crossing over the main active regions in the dummy cell array region; and
    a plurality of parallel bitlines electrically connected to the main active region between the plural wordlines,
    wherein the plurality of the bitlines cross over the common source lines, the wordlines, and the at least one dummy wordline.
2. The device as claimed in claim 1, wherein the common source lines are polysilicon patterns, metal silicide patterns or metal patterns.
3. The device as claimed in claim 1, wherein each of the common source lines is electrically connected to the main active regions via a slit-type contact hole exposing the main active regions and device isolation layers therebetween.
4. The device as claimed in claim 1, further comprising floating gates intervening between the couple of the wordlines and the main active regions, and dummy floating gates intervening between the at least one dummy wordline and the main active regions.

* * * * *